US006960423B2

(12) United States Patent
Goodin

(10) Patent No.: US 6,960,423 B2
(45) Date of Patent: Nov. 1, 2005

(54) PREPARATION OF GRAVURE AND INTAGLIO PRINTING ELEMENTS USING DIRECT THERMALLY IMAGEABLE MEDIA

(75) Inventor: Jonathan W. Goodin, Tsawwassen (CA)

(73) Assignee: Creo Inc. (CA)

( * ) Notice: Subject to any disclaimer, the term of this patent is extended or adjusted under 35 U.S.C. 154(b) by 174 days.

(21) Appl. No.: 10/319,502

(22) Filed: Dec. 16, 2002

(65) Prior Publication Data

US 2003/0124466 A1 Jul. 3, 2003

Related U.S. Application Data

(60) Provisional application No. 60/342,125, filed on Dec. 26, 2001.

(51) Int. Cl.[7] .............................. G03F 7/00; G03F 7/26

(52) U.S. Cl. ................. 430/307; 430/270.1; 430/280.1; 430/285.1; 430/302; 430/309; 430/945

(58) Field of Search ................................ 430/307, 302, 430/309, 945, 270.1, 280.1, 285.1; 101/459, 454, 456, 457; 427/150, 153

(56) References Cited

U.S. PATENT DOCUMENTS

| | | | | | |
|---|---|---|---|---|---|
| 2,980,535 | A | * | 4/1961 | Schroeter et al. | 430/270.1 |
| 3,476,937 | A | | 11/1969 | Vrancken | |
| 4,384,011 | A | * | 5/1983 | Aoyama et al. | 427/517 |
| 5,019,486 | A | | 5/1991 | Takakura | |
| 5,023,166 | A | | 6/1991 | Takakura | |
| 5,164,285 | A | | 11/1992 | Takakura | |
| 5,328,537 | A | | 7/1994 | Shigeta | |
| 5,491,046 | A | | 2/1996 | DeBoer et al. | |
| 5,641,608 | A | | 6/1997 | Grunwald et al. | |
| 5,925,497 | A | | 7/1999 | Li et al. | |
| 6,001,536 | A | | 12/1999 | Vermeersch et al. | |
| 6,048,446 | A | | 4/2000 | Michaelis | |
| 6,124,425 | A | | 9/2000 | Nguyen | |
| 6,242,155 | B1 | | 6/2001 | Yamasaki et al. | |
| 6,605,407 | B2 | * | 8/2003 | Yu et al. | 430/270.1 |
| 6,609,459 | B1 | * | 8/2003 | Figov | 101/150 |
| 2002/0081519 | A1 | | 6/2002 | Yu et al. | |
| 2002/0155374 | A1 | * | 10/2002 | Yu et al. | 430/270.1 |
| 2003/0207210 | A1 | * | 11/2003 | Goodin et al. | 430/302 |

FOREIGN PATENT DOCUMENTS

| | | |
|---|---|---|
| WO | WO 97/39894 | 10/1997 |

* cited by examiner

*Primary Examiner*—Throl Chea
(74) *Attorney, Agent, or Firm*—Madson & Metcalf

(57) ABSTRACT

A gravure printing element is fabricated using a negative-working thermally-imageable coating that is exposed using commercially available diode lasers, the coating being insensitive to ultraviolet light, daylight or visible light, and developable using aqueous media. A gravure etch mask is formed on a printing precursor by applying a coating of thermally-imageable material, curing the coating, image-wise illuminating the cured coating with a laser and removing with a developer the areas of the coating that were not illuminated. The masked precursor is then chemically etched to produce a gravure printing element.

20 Claims, 1 Drawing Sheet

PREPARATION OF GRAVURE AND INTAGLIO PRINTING ELEMENTS USING DIRECT THERMALLY IMAGEABLE MEDIA

CROSS-REFERENCE TO RELATED APPLICATION

The benefit of the filing date of provisional application Ser. No. 60/342,125, filed Dec. 26, 2001, entitled Preparation of Gravure and Intaglio Printing Elements using Direct Thermally Imageable Media, is claimed herein.

FIELD OF THE INVENTION

The invention pertains to the field of printing and, in particular, to gravure printing.

BACKGROUND OF THE INVENTION

At the present time, virtually all commercially printed copy is produced through the use of three basic types of printing. One type is a relief plate that prints from a raised surface. Another type, lithographic printing, is based on the immiscibility of oil and water wherein the oily material or ink is preferentially retained in the image area of a printing plate and the water or fountain solution is retained by the non-image area. The third type is gravure that prints from a depressed surface.

In gravure printing, depressions, known as cells, are fashioned with high resolution on an otherwise smooth metal printing surface. Ink is then supplied to the imagewise indented metal surface of the cylinder and the ink preferentially occupies the indentation cells. The ink-coated cylinder is then rolled against the printing media to effect the actual printing. The metal to be indented is typically, but not exclusively, copper. For subsequent protection of the indented printing surface, and to prolong the printing life of the printing surface, it may be coated with harder and more durable materials such as chromium.

Gravure printing plates or cylinders were traditionally prepared using etching techniques. In preparing such cylinders or plates for gravure printing, the copper printing surface is coated with a photosensitive gelatin to which a desired latent image is usually transferred by exposure to light through a halftone positive screen in conjunction with a film carrying a continuous tone positive image. The latent image is then developed and etched into the copper surface by methods well known in the art to form an intaglio image therein.

Prints made from such cylinders and plates by this traditional method have been found objectionable in that the edges of depicted objects, and particularly the edges of printed letters or numerals, are frequently jagged or sawtoothed in outline and appear fuzzy rather than sharp and smooth as is desirable.

A variety of methods have since been developed for fashioning the cells on the cylindrical printing surface. The most standard of these at this time is electromechanical indentation with a diamond stylus. The method comprises the following steps:

(a) opto-electronically scanning the original by means of an optical illumination and scanning system which includes means for placing the original into focus;

(b) conversion of the light signals obtained during scanning of the original into electrical signals which reproduce the intensity of the light signal and then processing the electrical signals in an electronic computer;

(c) engraving the printing form with a graving tool which is controlled by the electrical signals thus produced.

A number of alternative means have been developed more recently, such as electron beam engraving. Direct laser engraving has also been proposed. There are numerous potential workflow and efficiency advantages to such direct imagewise structuring of the gravure plate using digitally controlled beams to remove some of the constituent material. Clearly one of these is the obviating of the mask preparation step and associated costs. However, to the extent that metal is being engraved, the power requirements tend to be very high. This problem, along with concerns regarding the management of the debris and other resulting residues created in the process, render this generic approach largely unattractive.

Another category of relief printing plates, sleeves and cylinders may be prepared by coating the blank, unprocessed plate, sleeve or cylinder element with a photosensitive polymer. The required printing relief, either in the form of a gravure element or a flexographic element, may be obtained by Imagewise exposure of the photopolymer layer, either on negative-acting or positive-acting form and then developing the exposed element in a suitable developer. The drawback with this approach, as applied in particular to gravure or intaglio printing in general, is that the photopolymers cannot compare with the traditionally employed metals for hardness and durability. This results in limited run-length and defeats one of the traditional differentiating strengths of gravure as a technology. Additionally, the photopolymer tends to be scratched by the doctor blade during use. This results in unacceptable print quality.

One approach, described in U.S. Pat. No. 6,048,446 (Michaelis), is to address this shortcoming by proceeding through all the lithographic steps as described above, but to then plate gravure material in the areas where photopolymer has been removed.

As a result of more recent advances in the field of lithography, there have been renewed proposals for the use of various forms of resist to be used as screens though which to chemically etch the indentations. As has been demonstrated by the semiconductor industry, the level of sophistication and resolution obtained in resist-based etching is easily capable of providing the required cell resolution.

While chemical engraving has tended to be associated with the traditional photographic methods described earlier, gravure cylinders can in fact be produced using photo-resists exposed on laser imaging systems. Thus, chemical engraving may be employed in combination with the latest prepress technology as an alternative to electromechanical engraving. An example of this approach is the use of a laser to directly image a light-sensitive photopolymer resist using digital image data, followed by more traditional chemical etching to produce a gravure cylinder. This approach offers high speed of engraving together with the obvious attraction of being able to employ existing chemical engraving equipment lines. However, this approach has to date been based on rather expensive lasers of visible wavelengths. Along with this goes the inherent sensitivity of the coating media to ambient light, necessitating the use of amber or red light working conditions. Furthermore, the coating media employed tends to have a short shelf life.

Affordable infrared laser diodes or diode arrays with a very practical power output are now commercially available and can be used to form a mask image on top of a gravure printing element. The use of infrared wavelengths also inherently addresses the ambient light limitations of previous methods. The image to be developed can be translated into digital information and the digital information used to modulate the laser light for imaging. The laser light may be modulated, either within the laser or via a separate modulator, while being scanned across the media element.

Against this background there have been proposals for the preparation of gravure media elements employing a mask that is photo-imageable at wavelengths matching those produced by high efficiency laser diodes and diode arrays, such as those employed in commercial digital plate-making machines. However, the media suggested for use in these proposals is positive-working and suffers from the shortcoming that it has to be developed in a high pH developer. The basic positive-working approach suggested by these proposals also leads to operational problems with handling-induced printing artifacts, particularly in the specific case of gravure plates.

The need therefore remains in industry for a method to obtain a gravure printing element using digital imaging technology based on affordable commercial diode lasers and laser arrays and employing benign chemicals in the masking procedure. Particularly advantageous would be a method and apparatus that could reduce the amount of handling by integrating many of the gravure etch masking steps.

BRIEF SUMMARY OF THE INVENTION

It is an object of the present invention to provide a method by which gravure printing elements may be formed by digital means using a negative-working mask layer.

It is a further object of the present invention to make possible the fabrication of gravure elements by means of digitally controlled near infra-red lasers.

It is a further object of the present invention to provide a method for fabricating a gravure printing element, the method combining the benefits of etching with the benefits of digitally controlled lasers.

It is a further object of the present invention to provide a method for making an etch mask on a gravure printing precursor, the method employing water or aqueous media as a developer.

It is a further object of the present invention to integrate several of the gravure mask fabrication steps on one apparatus.

It is a further object of the invention to provide gravure printing precursors and gravure printing elements made in accordance with the methods described herein.

It is a further object of the invention to provide an apparatus for forming an etch mask on a gravure printing precursor.

The invention provides a method for forming an etch mask on a gravure printing precursor using a thermally-imageable coating that is exposed using commercially available diode lasers. The coating is largely insensitive to normal room light, and is developable using aqueous media. The masked presursor can then be chemically etched to produce a gravure printing element, to use for gravure printing.

According to the method of the invention, a coating of thermally-imageable material is applied to a gravure printing precursor. The coating is cured and then imagewise illuminated with light from a laser. A developer is then applied to remove those areas of the coating that have not been illuminated, revealing areas of the precursor. This forms a gravure etch mask on the printing precursor. The step of chemically etching the masked precursor can then be carried out to produce a gravure printing element.

The invention also provides an apparatus for forming the gravure etch mask on the printing precursor. It comprises an apparatus for applying the coating of thermally-imageable material, an apparatus for curing the coating, a laser for imagewise illuminating the coating, and an apparatus for removing with a developer those areas of the coating that have not been illuminated.

DETAILED DESCRIPTION OF THE PREFERRED EMBODIMENTS

Figure 1:
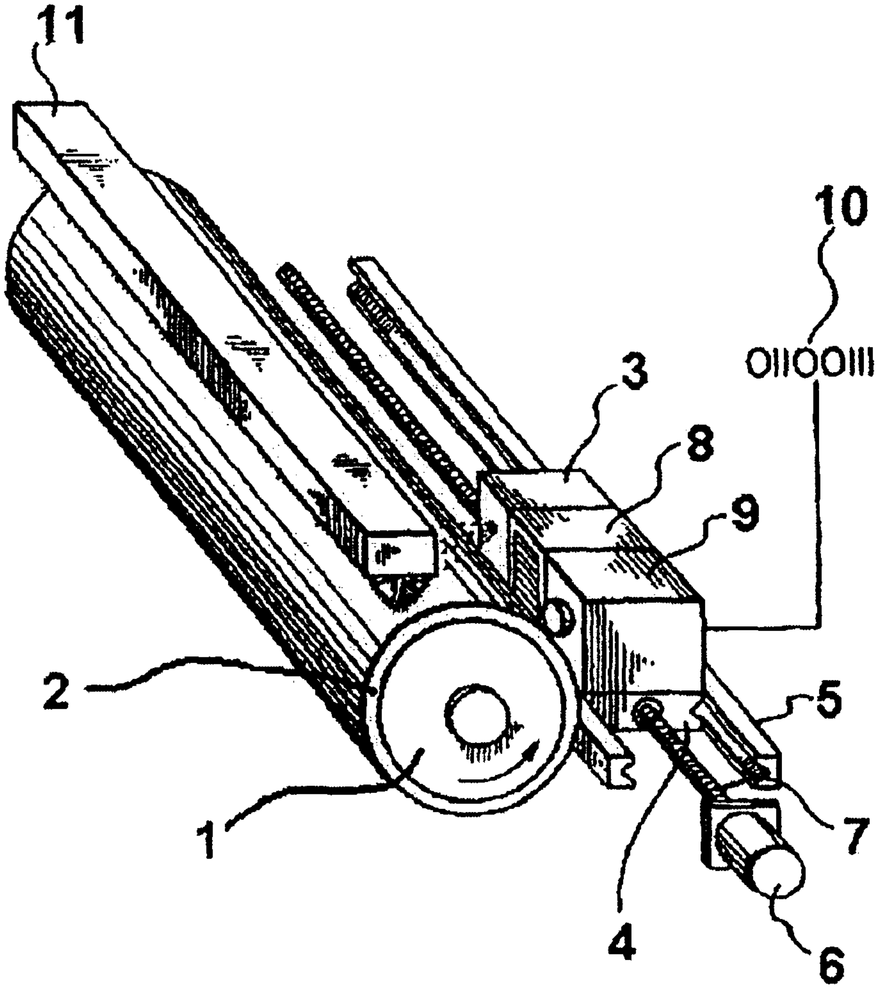
FIG. 1 shows a gravure platemaking apparatus capable of performing the platemaking steps of coating a printing precursor with a thermally-imageable material, curing the resulting coating, imaging the cured coating and developing the imaged coating to form a gravure etch mask on the precursor.

FIG. 1 shows a first preferred embodiment of the present invention. A gravure printing precursor 1, is mounted on an arbor or mandrel (not shown) so as to allow it to rotate about its cylindrical axis, and coated with a thermally-imageable layer 2 of thermally-imageable material. The term "gravure printing precursor" is used here to describe a blank, un-etched gravure cylinder or plate that has upon its surface a final metal layer that is to be etched to obtain the required gravure relief. The term "gravure printing element" is used herein to denote the etched gravure cylinder or plate that can be used for gravure printing. This metal of which the metal layer of the precursor is comprised, is typically, but not necessarily, copper. The methods for preparing such gravure printing precursors are well established and known to practitioners in the field, as are the specific plating and coating methods for providing the metal layer. These methods will not be further discussed herein. In the preferred embodiment of the present invention, gravure printing precursor 1 is a blank gravure cylinder.

In an alternative embodiment, gravure printing precursor 1 is itself a blank, unprocessed gravure plate or sleeve mounted on a cylindrical carrier mounted on the arbor or mandrel.

In the first preferred embodiment, thermally-imageable layer 2 is applied using a spray method, which is executed by spray unit 3 mounted on carriage 4. A linear track 5 is rigidly mounted parallel to gravure printing precursor 1, and carriage 4 is capable of traversing the entire width of gravure printing precursor 1 under the control of motor 6 and lead screw 7.

In one alternative embodiment, thermally-imageable layer 2 may be applied by a roller that extends across the width of gravure printing precursor 1. Such rollers, and the methods for applying liquid coatings, such as inks, using such rollers, are well known to practitioners of the art, and will not be discussed herein.

In further alternative embodiments, thermally-imageable layer 2 may be applied by any convenient method, including, but not limited to, extrusion coating, bar coating, wire wound rod coating, roll coating, screen coating, curtain coating, die slot coating, meniscus coating, or gravure coating.

Any one of a number of different thermally imageable materials may be employed to form thermally-imageable layer 2. The thermally-imageable material is preferably negative-working though it may also be positive-working. In the preferred embodiments of the present invention, the negative-working thermally-imageable materials described in commonly-owned co-pending U.S. patent application Ser. No. 09/745,548 (U.S. patent publication No. US-2002-

0081519-A1, dated Jun. 27, 2002), Ser. Nos. 09/909,792, 09/909,964, and 09/785,339 (U.S. patent publication No. US-2002-0155374-A1, dated Oct. 24, 2002), as well as those of U.S. Pat. No. 3,476,937 (Vranken) and U.S. Pat. No. 6,001,536 (Vermeersh) , are preferred. All of the thermally imageable materials disclosed in these applications and patents are developable using aqueous media. The specifications of U.S. patent application Ser. Nos. 09/745,548, 09/909,792, 09/909,964, and 09/785,339 are hereby incorporated in full by reference.

(i) U.S. patent application Ser. No. 09/745,548 (publication No. US-2002-0081519-A1) discloses a thermally-convertible image material comprising hydrophobic polymer particles, a substance for converting light into heat (for example, carbon black, a pigment or a dye) and an inorganic salt. The inorganic salt may include water-soluble metal salts and alkali metal salts. Examples of suitable salts include sodium acetate, potassium carbonate, lithium acetate and sodium metasilicate.

(ii) U.S. patent application Ser. No. 09/909,972 discloses a thermally-convertible image material comprising hydrophobic polymer particles in an aqueous medium, a substance for converting light into heat and a metal complex. The metal complex may comprise positive ions, negative ions or neutral molecules. It may be water-soluble or water-miscible. Suitable metal complexes include zinc acetate, copper (II) phthalocyaninetetrasulphonic acid, tetra sodium salt, aluminum acetylacetonate, cobalt acetylacetonate, and zinc acetylacetonate.

(iii) U.S. patent application Ser. No. 09/909,964 discloses a thermally-convertible image material comprising hydrophobic polymer particles, a substance for converting light into heat and an organic acid. The organic acid may be water-soluble or water-miscible. Examples of suitable organic acids include malonic acid, D, L lactic acid and citric acid.

(iv) U.S. patent application Ser. No. 09/785,339 (publication No. US-2002-0155374-A1) discloses a thermally-convertible image material comprising hydrophobic polymer particles, a substance for converting light into heat and an organic base. The organic base may be a water-soluble organic base or a water-miscible organic base. Examples of suitable organic bases include piperazine, 2-methylpiperazine and 4-dimethylaminobenzaldehyde.

(v) U.S. Pat. No. 3,476,937 (Vrancken) describes a material that is thermally-imageable and is composed either of finely divided particles of a hydrophobic thermoplastic polymer arranged in discrete contiguous relationship, or consisting essentially of a dispersed phase of such polymer particles distributed generally homogeneously through a continuous phase of a hydrophilic binding agent applied from an aqueous medium. The heat applied is sufficient to at least partially coalesce the polymer particles in the affected areas of a layer of the material and to significantly reduce the fluid permeability of the layer in these affected areas. The layer may contain other materials such as colorants or color developable agents.

(vi) U.S. Pat. No. 6,001,536 (Vermeersch) describes a thermally-imageable material comprising hydrophobic thermoplastic polymer particles dispersed in a non-hardened hydrophilic binder and a compound capable of converting light to heat. The hydrophobic thermoplastic particles have a glass transition temperature $T_g$ of at least 80° C. Upon exposure to light that is convertible by the light-to-heat converting compound, the thermoplastic particles in the illuminated portions of the thermally-imageable material coalesce. In a subsequent development step, the unexposed areas of the thermally-imageable material may be removed by plain tap water or an aqueous liquid. In the patent the hydrophilic binder is selected from the group consisting of poly(meth)acrylic acid, poly(meth)acrylamide, polyhydroxyethyl(meth)-acrylate and polyvinylmethyl-ether.

The thermally-imageable materials described in all six of the above patent applications and patents are imageable by laser heads as described in the first preferred embodiment of the present invention and may all be dried using hot air or radiant heat. They are all insensitive to room light and therefore do not require special lighting conditions for their processing.

Alternative negative working-thermally-imageable materials may be employed to create thermally-imageable layer 2. Some examples of these are described in U.S. Pat. No. 5,491,046 (De Boer), U.S. Pat. No. 5,641,608 (Grunwald), U.S. Pat. No. 5,925,497 (Li), 6,124,425 (Nguyen), U.S. Pat. No. 6,242,155 (Yamasaki) and in WO9739894 (Parsons).

(i) U.S. Pat. No. 5,491,046 (De Boer) describes a thermally-imageable material that was developed for lithographic printing, and that comprises an admixture of a resole resin, a novolac resin, a latent Bronsted acid and an infrared absorber. This material may be employed as a negative-acting medium by heating it in an additional step with intense infrared radiation from curing unit 8 after imaging with multichannel laser head 9. By employing an alkaline developer, the unexposed areas of thermally imageable layer 2 may be removed to produce a gravure etch mask. Clearly, because of the use of corrosive alkaline developer, this embodiment of the invention is not ideal for implementation on an integrated apparatus, and is better implemented in an alternative embodiment where the development of the mask is carried out in a separate developing unit.

(ii) U.S. Pat. No. 5,641,608 (Grunwald) describes a thermally-imageable resist, developed for printed circuit board application, and comprising a styrene-maleic-anhydride copolymer. Various examples of this invention are described using either organic solvents or alkaline solutions as developers. This material is also preferably employed in systems where the mask development is separated from the preceding steps of the method.

(iii) U.S. Pat. No. 5,925,497 (Li) describes a negative-working photosensitive composition containing a polymer of the formula B(X)(Y), wherein B represents an organic backbone, each X independently is an acidic group or salt thereof and each Y independently is a photo-curable group and a photo-initiating compound or compounds with sensitivity up to 850 nm. Areas of this material struck by light of wavelength matching the absorption spectrum photo-cure and thereby become insoluble in aqueous and organic media. The areas not irradiated with that light remain soluble in the fountain.

(iv) U.S. Pat. No. 5,928,833 (Matthews) describes a radiation-sensitive coating that includes (a) core-shell particles, the core-shell particles comprising an oleophilic water-insoluble, heat-softenable core component (A) having a minimum film-forming temperature above room temperature and a shell component (B) which is soluble or swellable in aqueous medium, the shell component (B) being a polymer containing carboxylic acid, sulphonic acid, sulphonamide, quaternary ammonium, or amino groups; and, (b) a radiation-sensitive component (C) which, on exposure to radiation, changes the solubility characteristics of the coating, wherein the core (A) and the shell (B) components of the particles remain as separate components prior to the application of heat to the coating, but coalesce on the application of heat to the coating, and wherein the core-shell particles are distributed throughout the radiation-sensitive component (C), wherein the radiation-sensitive component (C) does not comprise part of the core-shell particles.

(v) U.S. Pat. No. 6,124,425 (Nguyen) describes a near infrared absorption polymer comprising (a) a near infrared absorption segment, which exhibits strong absorption bands between 780 and 1200 nm; (b) a processing segment providing film forming properties and solubility in aqueous solutions having pH between 2.0 and 14.0; (c) a thermally reactive segment, which undergoes localized chemical or physical reactions, with or without catalysts, upon localized exposure to near infrared laser light so that said polymer becomes locally insoluble in aqueous solutions, the polymer being soluble in aqueous solutions prior to exposure to near infrared light.

(vi) U.S. Pat. No. 6,242,155 (Yamasaki) describes a family of photopolymer compositions for recording images by exposure to infrared beams. The composition comprises a photothermal converter and a polymer that is thermally decarboxylated. Examples are given of the use of these photopolymers in making lithographic plates. While no separate development step was employed, the lithography process did include treatment either plain tap water or a fountain solution mix of water, IPA, triethylamine and HCl to remove unexposed portions of the plate.

(vii) WO9739894 (Parsons) describes, coated in particular on a lithographic base, a complex of a developer-insoluble phenolic resin and a compound which forms a thermally frangible complex with the phenolic resin. This complex is less soluble in the developer solution than the uncomplexed phenolic resin. However, when this complex is imagewise heated the complex breaks down so allowing the noncomplexed phenolic resin to the dissolved in the developing solution. Thus the solubility differential between the heated areas of the phenolic resin and the unheated areas is increased when the phenolic resin is complexed. Preferably a laser-radiation-absorbing material is also present on the lithographic base. A large number of compounds which form a thermally frangible complex with the phenolic resin have been located. Examples of such compounds are quinolinium compounds, benzothiazolium compounds, pyridinium compounds and imidazoline compounds.

All of the thermally-imageable materials, as described in U.S. Pat. No. 5,491,046 (De Boer), U.S. Pat. No. 5,641,608 (Grunwald), U.S. Pat. No. 5,925,497 (Li), U.S. Pat. No. 6,124,425 (Nguyen) U.S. Pat. No. 6,242,155 (Yamasaki) and in WO9739894 (Parsons), may be employed in their respective ways in negative-working methods and may be used to prepare gravure etch masks by the method of the present invention. To the extent that they employ developers that are to a lesser or greater degree corrosive or dangerous, they are preferably executed on apparatus that separate the mask development from the preceding steps of coating, drying and imaging.

Curing unit 8 is also mounted on carriage 4 and may traverse the entire width of gravure printing precursor 1 under the control of motor 6 and lead screw 7. After application of thermally-imageable layer 2, this layer is cured using curing unit 8. The term "curing" is here used to describe the process of hardening or solidification of thermally-imageable layer 2 and includes drying, as well as processes that involve chemical change of thermally-imageable layer 2. The most preferable method of curing in this preferred embodiment of the present invention is simple drying by heating, using direct heat from curing unit 8 in the form of radiant heat or hot air. For some thermally-imageable materials, partial or complete curing using ultraviolet or infrared radiation is also possible. The thickness of thermally-imageable layer 2 is preferably from 0.5 to 15 microns, and more preferably 0.7 to 10 microns, thus the amount of material to be cured is small and the energy required for curing is manageable, even for rapid curing. A drying unit of 6 kW may advantageously be used.

After curing, the polymer surface is imaged by laser imaging head 9, which is preferably also mounted on carriage 4 and moves under the control of motor 6 and lead screw 7. During imaging, the rotary motion of gravure printing precursor 1 and motor 6 are synchronized using shaft encoders in a manner similar to all drum imaging devices. Drum imaging devices are well known and have been commercially available for many years. Thus, no further details of the synchronization and handling of the image data will be given herein. In order to image the complete surface of gravure printing precursor 1 in a short time (in the order of one or two minutes) a large number of beams are required as well as a relatively high power. Multi-beam laser imagers are well known. By the way of example, a suitable laser array is described in U.S. Pat. No. 4,743,091 (Gelbart). The number of beams required depends on the required imaging time, power, and the maximum rotational speed of gravure printing precursor 1. An example of an infrared imaging head, capable of performing the imagewise illumination, is commercially available from Creo Inc. of Burnaby, British Columbia, Canada. These heads typically are based on infrared diode arrays. The wavelength of the light emitted by these heads is preferably, but not necessarily, between 700 nm and 1100 nm and more preferably between 700 and 900 nm. Most typically these infrared imaging heads are modulated using any one of a variety of spatial light modulators. The techniques for modulation of such multichannel heads are well established and will not be further discussed herein.

In alternative embodiments of the present invention, other infrared light sources and imaging heads may be employed to image thermally-imageable layer 2. This includes a laser imaging head 9 that employs laser diodes of other infrared wavelengths, or YAG-lasers or any laser of which the wavelength matches the near infrared optical absorption spectrum of thermally imageable layer 2. In particular, laser imaging head 9 may be of the type known as a fibre coupled head.

After completion of the curing process, laser imaging head 9 selectively addresses thermally-imageable layer 2. This is done in accordance with data 10 supplied by a controller (not shown). Preferably, the changes in the thermally-imageable material are purely thermally induced, so that any type of laser can be used. Laser diodes operating in the near infrared are the preferred source. Preferably the cylinder is imaged at a resolution of at least 1800 dpi and more preferably at least 2400 dpi. Reducing the resolution does not reduce the imaging time in most cases, as the process is limited by the amount of energy required, not the data rate. During the imaging step, registration can be precisely controlled by the machine. Digitized imaging by this general approach is particularly well suited for making seamless, continuous printing forms such as gravure cylinders and sleeves.

After being imaged, thermally imageable layer 2 is treated with developer, which removes the non-imaged areas of layer 2, leaving the imaged areas as a gravure etch mask. A wide range of methods can be used for applying the liquid developer to a surface. In the preferred embodiment of the present invention, liquid developer is applied by developer unit 11, which is positioned across the width of gravure printing precursor 1. It may be moved away from gravure printing precursor 1 to an alternative position during the other process stages. In the first preferred embodiment of the present invention, the developer liquid is an aqueous medium.

In an alternative embodiment, developer unit 11 is replaced by a developer unit that sprays developer and which is also mounted on carriage 4 to traverse the width of gravure printing precursor 1 under the control of motor 6 and lead screw 7.

The result of the development step is a gravure printing precursor that now has a gravure etch mask and is ready for chemical etching of the element in the areas not covered by the mask to form a gravure printing element. The specific polymers chosen for the mask of necessity need to be resistant to one or more of the commonly used etching solutions for the metal cylinder, for example ferric chloride solution. The preferred embodiment of the present invention therefore comprises a method for the manufacture of gravure printing elements using a negative-working thermally-imageable coating that is exposed using commercially available diode lasers, the coating being insensitive to sunlight or normal room light, and developable using aqueous media.

While the preferred embodiment of the present invention employs a method and apparatus that integrate coating, drying, imaging and development on one apparatus, thereby providing workflow, handling and turnaround-time benefits, the steps of the method may be executed on separate apparatus.

One particular embodiment of the present invention separates the development step from the other preceding steps of the method. The development is conducted in a separate physical unit. This unit may be combined with the actual copper etching facility that is used to etch the copper of gravure printing precursor 1 to produce the actual gravure printing element to be used in printing.

EXAMPLE 6 g Texigel 13-800, 12 g 5 wt % sodium phosphate in water, 12 g 1 wt % ADS 830A and 1 g of tripropargylisocyanurate in ethanol, 36 g water were mixed and the resultant emulsion was coated onto a copper cylinder using a spray device. The coating was dried using forced air at a temperature of 60 C for 1.5 minutes. The resultant coating had a coating weight of 1.0 g/m$^2$. The cylinder was imaged with a Creo Inc. laser exposure device using 830 nm light. The exposure was carried out with 750 mJ/cm$^2$ at 18 Watts. The non-image areas were removed using a water spray at 20 C for 20 seconds. The coating was dried with air. The cylinder was etched using an acid etch solution of copper chloride, hydrogen peroxide and hydrochloric acid to produce the gravure cells.

Equipment and special materials were sourced as follows:

Texigel: Scott Bader Inc. of Hudson, Ohio, U.S.A.

ADS 830A: American Dye Source of Montreal, Quebec, Canada.

Laser exposure device: Creo Inc. of Burnaby, British Columbia, Canada.

There has thus been outlined the important features of the invention in order that it may be better understood, and in order that the present contribution to the art may be better appreciated. Those skilled in the art will appreciate that the conception on which this disclosure is based may readily be utilized as a basis for the design of other apparatus, products and methods for carrying out the several purposes of the invention. It is most important, therefore, that this disclosure be regarded as including such equivalent apparatus, products and methods as do not depart from the spirit and scope of the invention.

What is claimed is:

1. A method for forming a gravure etch mask on a gravure printing precursor comprising the steps of:

(a) applying a coating of thermally-imageable material to a gravure printing precursor;

(b) curing said coating of thermally-imageable material;

(c) imagewise illuminating said cured coating of thermally-imageable material with a laser; and (d) removing with a developer those areas of said coating of thermally-imageable material that have not been illuminated, thereby revealing areas of said gravure printing precursor.

2. A method according to claim 1 further comprising the step of chemically etching said gravure printing precursor in the areas of said gravure printing precursor revealed by said step of removing, to produce a gravure printing element.

3. A method according to claim 1 wherein step (a) is done by spraying said thermally-imageable material.

4. A method according to claim 1 wherein step (a) is done by rolling said thermally-imageable material.

5. A method according to claim 1 wherein said coating of thermally-imageable material is applied to a thickness of 0.5–15 microns.

6. A method according to claim 1 wherein said coating of thermally-imageable material is applied to a thickness of 0.7–10 microns.

7. A method according to claim 1 wherein step (b) is done by drying using heat.

8. A method accordingly to claim 1 wherein step (b) is done by applying ultraviolet or infrared radiation.

9. A method according to claim 1 wherein said laser emits light having a wavelength greater than 700 nm.

10. A method according to claim 1 wherein said laser emits light having a wavelength between 700–1100 nm.

11. A method according to claim 1 wherein said developer is an aqueous medium.

12. A method according to claim 1 wherein said thermally-imageable material comprises: (a) hydrophobic polymer particles; and (b) a material for converting light into heat.

13. A method according to claim 12 wherein said thermally-imageable material further comprises an organic base.

14. A method according to claim 13 wherein said organic base comprises piperazine, 2-methylpiperazine and 4-dimenthylaminobenzaldehyde.

15. A method according to claim 12 wherein said thermally-imageable material further comprises a metal complex.

16. A method according to claim 15 wherein said metal-complex comprises zinc acetate, copper (II) phthalocyanine-tetrasulphonic acid, tetra sodium salt, aluminum acetylacetonate, cobalt acetylacetonate, and zinc acetylacetonate.

17. A method according to claim 12 wherein said thermally-imageable material further comprises an inorganic salt.

18. A method according to claim 17 wherein said inorganic salt comprises sodium acetate, potassium carbonate, lithium acetate or sodium metasilicate.

19. A method according to claim 12 wherein said thermally-imageable material further comprises an organic acid.

20. A method according to claim 19 wherein said organic acid comprises malonic acid, D, L lactic acid or citric acid.

* * * * *